United States Patent
Upton et al.

(10) Patent No.: US 7,369,600 B2
(45) Date of Patent: May 6, 2008

(54) BURST COMMUNICATIONS APPARATUS AND METHOD USING TAPPED DELAY LINES

(75) Inventors: Eric L. Upton, Belleview, WA (US); James M. Anderson, Huntington Beach, CA (US); Edward M. Garber, Los Angeles, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 680 days.

(21) Appl. No.: 10/740,766

(22) Filed: Dec. 22, 2003

(65) Prior Publication Data
US 2005/0135529 A1    Jun. 23, 2005

(51) Int. Cl.
*H04B 1/00* (2006.01)
(52) U.S. Cl. .......... 375/142; 324/76.33; 324/76.35; 324/76.54; 331/57; 359/306; 359/331; 375/365; 375/366; 375/367; 375/373; 375/376
(58) Field of Classification Search .......... 365/45; 386/21; 375/261, 367; 341/95; 359/107; 398/202; 340/310.11; 702/108; 331/57; 360/41; 327/141, 149
See application file for complete search history.

(56) References Cited

U.S. PATENT DOCUMENTS

| 4,322,819 | A | * | 3/1982 | Hyatt ............................ 365/45 |
|---|---|---|---|---|
| 4,956,720 | A | * | 9/1990 | Tomisawa ..................... 386/21 |
| 4,993,046 | A | * | 2/1991 | Saito et al. .................. 375/261 |
| 5,016,011 | A | * | 5/1991 | Hartley et al. ................ 341/95 |
| 5,410,570 | A | * | 4/1995 | Ladha et al. ................. 375/367 |
| 5,724,007 | A | * | 3/1998 | Mar ............................ 331/1 A |
| 6,275,311 | B1 | * | 8/2001 | Boffi et al. ................. 359/107 |
| 6,608,552 | B1 | * | 8/2003 | Fogel et al. ............ 340/310.11 |

* cited by examiner

*Primary Examiner*—David C. Payne
*Assistant Examiner*—Adolf DSouza
(74) *Attorney, Agent, or Firm*—Jones, Tullar & Cooper, P.C.

(57) ABSTRACT

A communications apparatus and method use tapped delay lines as multiplexers and demultiplexers. In one embodiment, a receiver (100) uses a tapped delay line (110) as a demultiplexer to acquire a burst communication at very high data rates in the range of 2.5 to 80 Gbps with low preamble overhead. A sliding window correlator (114) continually samples the delay line (110) to determine when a PN encoded word is contained therein. The transmission frequency is pre-acquired before any data is present through the use of a ring oscillator frequency calibration loop (130) that is imbedded within the tapped delay line (110).

17 Claims, 3 Drawing Sheets

BURST COMMUNICATIONS APPARATUS AND METHOD USING TAPPED DELAY LINES

BACKGROUND OF THE INVENTION

1. Field of the Invention

The present invention relates in general to a communications apparatus and method wherein tapped delay lines and a sliding window correlator are used as a demultiplexer to acquire gigabit per second or higher rate data frames quickly and efficiently with a low synchronization overhead. Although not limited thereto, the invention is particularly suited for use in optical high-speed burst communications.

2. Description of the Background Art

In digital communications techniques, such as optical fiber communications, frames of data are modulated and typically transmitted at frequencies in excess of one gigabit per second. In order to receive such a transmission, a receiver must acquire the transmitted signal before the information may be extracted. Acquiring a signal includes determining the carrier frequency and the bit phase or timing so that the receiver may synchronize with the transmitted signal. In the past, receivers have typically employed a frequency sweep technique in order to acquire the carrier frequency. In the frequency sweep technique, the receiver hypothesizes the correct carrier frequency and searches many frequencies over a predetermined uncertainty range. At each hypothesis, the receiver must also try to acquire bit timing. If the hypothesis fails, the receiver must continue trying to acquire the carrier frequency.

Once the receiver has acquired the carrier frequency, the receiver must then synchronize with the bit phase or timing in the transmitted frame, a process often referred to as clock recovery. In the past, as with carrier frequency acquisition, clock recovery has also typically involved trial and error demodulation of the transmitted signal at the receiver in order to determine where individual bits begin and end. For example, when a particular trial demodulation yields incorrect data, the receiver either advances or retards its approximation to the bit timing and makes another attempt. In the past, therefore, the frequency and bit timing acquisition process often requires substantial time and processing power.

As a result of the foregoing, a receiver cannot typically acquire the carrier frequency and bit timing immediately so that numerous data bits may pass by before the receiver is able to recover information. Thus, to give receivers time to acquire the carrier frequency and bit timing, transmitters typically transmit long preambles or headers of modulated information before the data frame. Although the headers required to allow receivers to acquire the carrier frequency with acceptable probability often introduce an overhead of as much as 30% compared to the actual data in the frame, the use of long preambles is nevertheless acceptable in continuous communications since the preamble length is still small relative to the data stream that follows. However, in burst communications, in which data is transmitted in short segments or bursts, each of which requires carrier frequency and symbol phase acquisition, the use of long preambles is not acceptable since the preambles may well be longer than the data itself. As a result, the long acquisition time associated with resolving both the frequency and the phase uncertainty of the transmitted waveform is incompatible with high-speed burst communications. This is especially true in the case of high-speed burst communications where data rates are in the gigabit per second (Gbps) range or higher.

Another issue presented by burst and other high-speed communications in the Gbps speed range, is the attendant requirement of correspondingly high-speed sampling, clock and other circuitry in the transmitters and receivers that can substantially increase power requirements and costs.

In view of the foregoing, a need remains for an improved signal acquisition technique that can quickly acquire the carrier frequency and bit phase or timing of a signal and is compatible with high-speed burst communications schemes.

SUMMARY OF THE INVENTION

To fulfill the foregoing need, the present invention provides a communications apparatus and method in which analog tapped delay lines are employed as multiplexers and demultiplexers for converting parallel data streams to serial data streams and vice versa. Although not limited thereto, the invention is particularly suited for use in a transceiver having a transmitter and a receiver. In the transmitter, a first analog tapped delay line converts data words comprised of parallel data bits into a serial analog data stream, which is then modulated and transmitted. In the receiver, a second analog tapped delay line is employed as a demultiplexer which converts a received serial analog data stream back into sequences of multiple parallel bit data words. The receiver employs a sliding window correlator that continually monitors the output taps of the second tapped delay line and generates a sync output signal whenever a data word is aligned in the stages of the delay line. This sync signal is then employed to control the latching of the parallel data symbols for each data word out of the stages of the same or a different tapped delay line. The receiver can therefore acquire the frequency and phase of a received data stream quickly (e.g., in less than 0.1% of the frame time), thereby avoiding the need for long preambles and making the technique especially suited for use in high-speed burst communications. In addition, the transmission baud rate of the serial data stream is equal to the number of bits per data word multiplied by the clock rate of the multiplexer/demultiplexer circuitry in the transmitter and receiver, thus allowing higher data transmission speeds without requiring higher speed clock and other circuitry.

To facilitate operation of the sliding window correlator, each of the data words is encoded prior to being transmitted. The sliding window correlator works by continually correlating the outputs of each stage of the delay line with corresponding symbols of a reference encoded data word to determine the instant at which the input waveform in the stages of the delay line comprises an encoded word. When this occurs, a control signal is generated that can be used to latch symbols for each data word in the serial data stream into a multiple bit parallel output latch.

A frequency calibration loop is also preferably provided in the receiver in the form of a ring oscillator that includes the tapped delay line. The oscillator frequency is employed to continuously track the input signal's frequency and control the delay characteristics of the delay line. The frequency calibration loop and the sliding window correlator thereby facilitate acquisition of the frequency and symbol phase simultaneously for all symbols in the word, thus providing faster acquisition using a short data frame preamble. The correlator resolves the phase of the input waveform for all possible phase possibilities since the delay line is analog and therefore continuous, while the frequency is pre-acquired before any data is present through the use of the ring oscillator that operates at a known fractional multiple of the desired baud rate.

BRIEF DESCRIPTION OF THE DRAWINGS

The features and advantages of the present invention will become apparent from the following detailed description of a number of preferred embodiments thereof, taken in conjunction with the following drawings, in which.

DETAILED DESCRIPTION OF THE PREFERRED EMBODIMENTS

Figure 1:
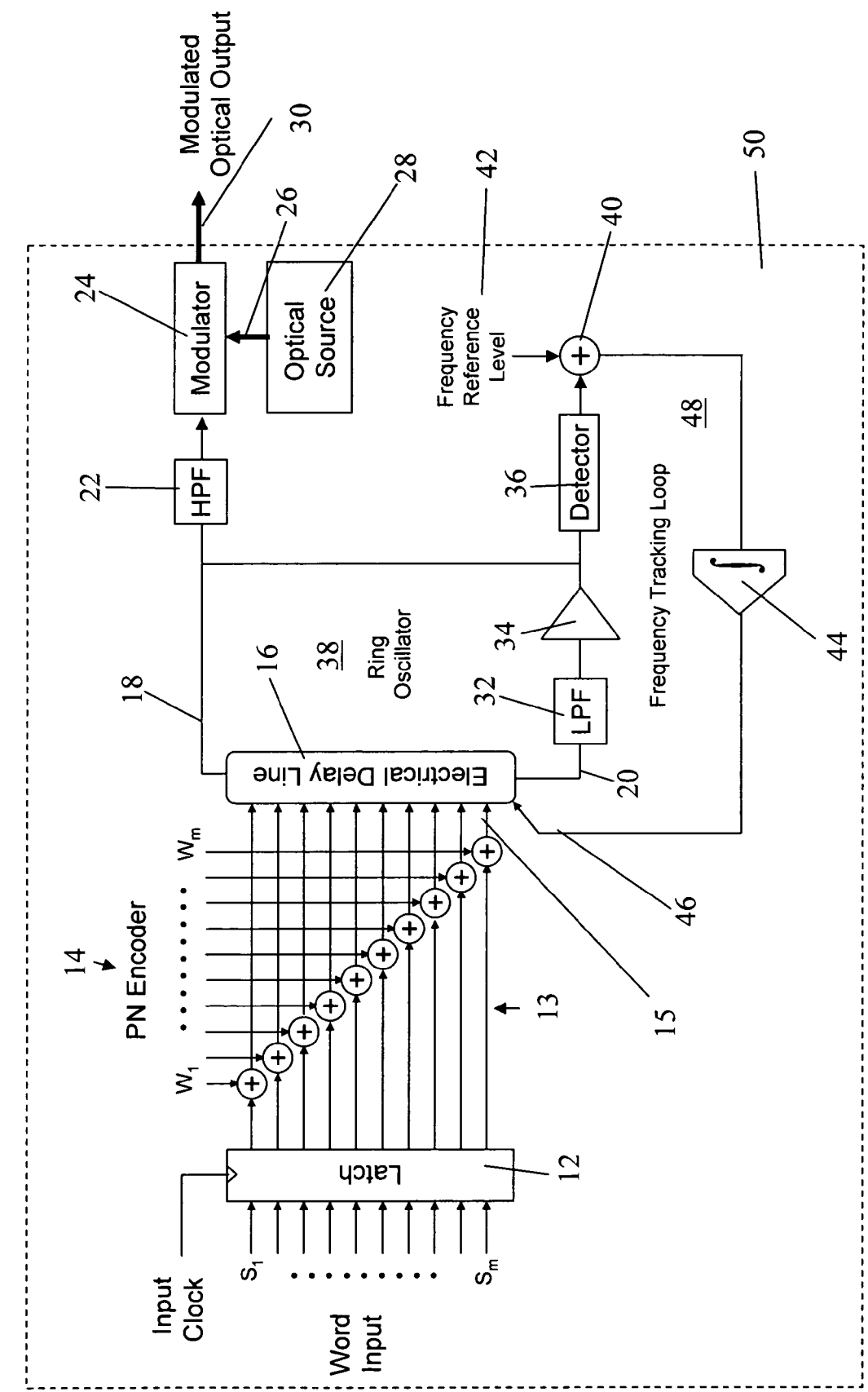
FIG. 1 is a schematic block diagram of a transmitter that employs a tapped delay line multiplexer to generate a modulated encoded transmission signal in accordance with the preferred embodiments of the invention.

With reference to FIG. 1, a transmitter 10 is illustrated that is employed to generate an encoded serial data stream in accordance with the preferred embodiments of the present invention. The transmitter 10 receives parallel input data in the form of multiple bit words in an input latch 12. The number (m) of bits in each word can be arbitrarily chosen as desired but in one preferred embodiment is selected to be 16.

Each of the bits in the word is clocked from the input latch 12 into a corresponding one of (m) inputs 13 of a pseudorandom number (PN) encoder 14 that encodes the bits into symbols in such a manner that each word can be identified in a data stream as will be discussed in more detail in conjunction with FIGS. 2 and 3. More particularly, the PN encoder 14 adds or subtracts a fixed number to each bit's value. Thus, for a binary data stream having two different possible bit values, the encoding process provides four possible symbol values. As an example, if the values 1, −1 are employed to represent the bit values 1 and 0, a value of 0.1 can be added or subtracted to these, thus giving the four possible symbol values 1.1, 0.9, −0.9 and −1.1.

The encoded symbols are each fed into a corresponding one of (m) taps 15 of an (m) stage analog tapped electrical delay line 16 which acts as parallel to serial converter or multiplexer that converts the input parallel symbols of each word into an analog waveform comprised of a serial data stream. As connected, the serial data stream actually flows in opposite directions out a first serial output 18 and a second serial output 20 located at opposite ends of the delay line 16. The first output 18 supplies the data stream through a high pass filter 22 to an optical modulator 24. The modulator 24 modulates an output beam 26 from an optical source 28 (e.g., laser diode or the like) with the data stream to thereby generate a modulated optical output beam 30 that is suitable for transmission via a fiber optic cable. It will of course be understood, however, that other forms of modulation and transmission can be employed with the transmitter 10.

The analog waveform also travels out the second serial output 20 from the delay line 16 for frequency control purposes as will be shown presently. First, the waveform passes though a low pass filter 32, which removes the high frequency serial symbol information from the waveform, and then through an amplifier 34 that conditions the waveform for detection by a frequency detector 36. The output waveform from the amplifier 34 is also fed back into the delay line 16 through its first output 18. The resulting feedback loop forms a ring oscillator 38 that oscillates at a fundamental frequency that is determined by the path length and delay characteristics of the delay line 16. This frequency is detected by the detector 36 and combined in an adder circuit 40 with a frequency reference level 42. The frequency reference level 42 is set equal to the desired transmission frequency of the data stream. When the detected frequency is higher or lower than the frequency reference level, an error signal is generated and fed through an integrator 44 to a control input 46 on the delay line 16 that controls its delay characteristics. This forms a frequency tracking loop 48 which controls the output frequency of the delay line 16 by adjusting its delay characteristics.

It should be noted that due to the high data transmission frequency of the preferred embodiment, which is on the order of 10's of Gbps, for example, all of the components of the transmitter 10 can be fabricated on a single chip or substrate 50 as indicated by the dashed lines in FIG. 1, since the signal wavelengths and therefore size of the various components are very small.

Figure 2:
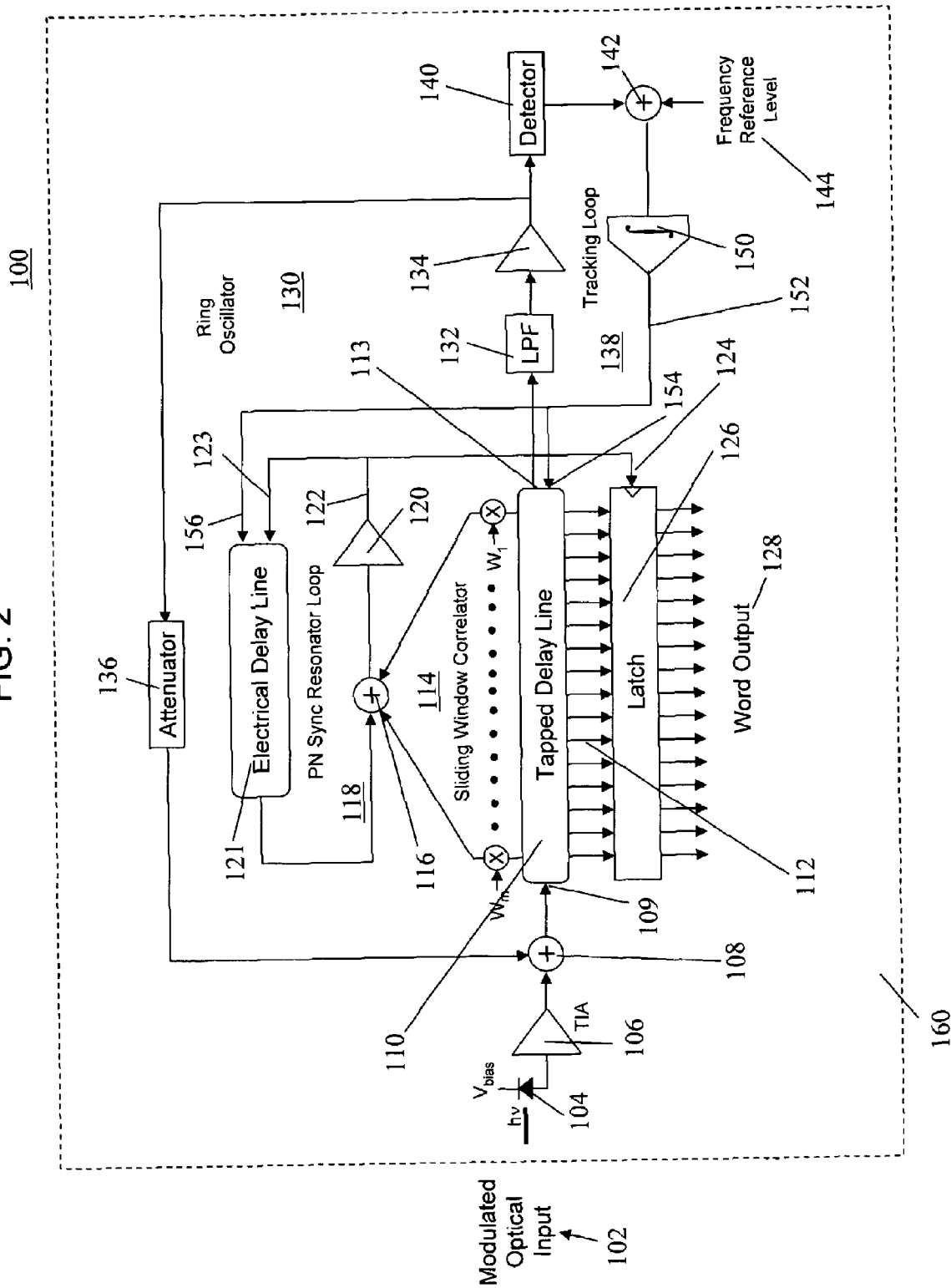
FIG. 2 is a schematic block diagram of a receiver that employs a tapped delay line demultiplexer to receive and decode a modulated encoded transmission signal in accordance with a first preferred embodiment of the invention.

With reference now to FIG. 2, a first preferred embodiment of a receiver 100 is illustrated that can be used to detect and receive a data stream that has been modulated with the transmitter 10 of FIG. 1, for example. A modulated optical input beam 102, which may be received through an optical fiber cable, for example, is detected by an optical detector 104, such as a PIN diode, and amplified by a trans-impedance amplifier 106 that serves an impedance matching function. Next, the detected and amplified waveform is combined with a ring oscillator signal in a first adder circuit 108 and is then fed into an input 109 of a multiple stage analog tapped delay line 110. The analog tapped delay line 110 includes a group of (m) taps 112, one for each symbol in each received word, and acts as a serial to parallel converter or a demultiplexer to convert the incoming analog serial data stream into a parallel output data stream. The tapped delay line 110 also includes a serial output 113 that is employed for frequency calibration purposes as will be discussed in greater detail later.

A sliding window correlator 114 is provided that continually samples each of the taps 112 to analyze the values of each stage in the delay line 110. More particularly, the sliding window correlator 114 continually computes the dot product of each symbol in the tapped delay line 110 and a corresponding symbol in a reference pseudorandom encoded word $W_1, \ldots, W_m$. The results of these computations are combined in a second adder 116, which normally generates a steady magnitude output signal that is representative of background noise, but will generate a slightly greater magnitude spiked output signal whenever a complete PN encoded word is present in the tapped delay line 110. This output signal is fed from the second adder 116 into a PN synchronizing resonator loop 118, which serves a signal amplification function in the following manner. The PN synchronizing resonator loop 118 includes an amplifier 120 and an electrical delay line 121 such that an output 122 of the amplifier 120 is connected to an input 123 of the delay line 121. The electrical delay line 121 is selected to set the loop length exactly to the length of an (m) symbol word. As a result, each time a spike is generated by the second adder 116, the spike will be added to previous signal already traveling around the resonator loop 118, thus increasing the magnitude of the signal, which is also connected to a control input 124 of an output latch 126. This process continues and when the signal is of sufficient magnitude, the signal will cause the output latch 126 to latch the symbols of the word in the tapped delay line 110 at exactly the right instant and make the word available as a word output 128 for the receiver 100. It should be noted that the resonator loop 118 is needed because the magnitude of the spike received from the sliding window correlator 114 is typically only slightly higher than the background noise and is thus not sufficiently discernable to be used as a control input for the output latch 126. The resonator loop 118 solves this problem by effectively amplifying the spike, but not the background noise signal, until he spike is of great enough magnitude to actuate the output latch 126.

To maintain frequency synchronization, a ring oscillator 130 is provided that is formed by the first adder circuit 108, the tapped delay line 110, a low pass filter 132, an amplifier 134 and an attenuator 136. An oscillating signal travels around the ring oscillator 130 and through the input 109 and serial output 113 of the tapped delay line 110 at a frequency that is dependent on the delay characteristics of the tapped delay line 110. A frequency tracking loop 138 is employed to maintain this frequency equal to that of the received symbols. As in the frequency tracking loop 48 of the transmitter 10 shown in FIG. 1, a detector 140 generates a frequency signal that is combined in a third adder circuit 142 with a frequency reference level 144 that is pre-selected to be some multiple of the carrier frequency of the received data stream. The output of the adder circuit 142 is fed through an integrator 150, which then generates a control signal 152 that is connected to a control input 154 of the tapped delay line 110 and a control input 156 of the delay line 121. As a result, the delay characteristics of the tapped delay line 110 and the delay line 121 are adjusted to maintain synchronism of the incoming data stream with the resonator loop 118.

As with the transmitter 10 of FIG. 1, the receiver 100 can also be fabricated on a single chip 160, which could be the same chip as the chip 50 used for the transmitter 10 in the case of a transceiver embodiment.

Figure 3:
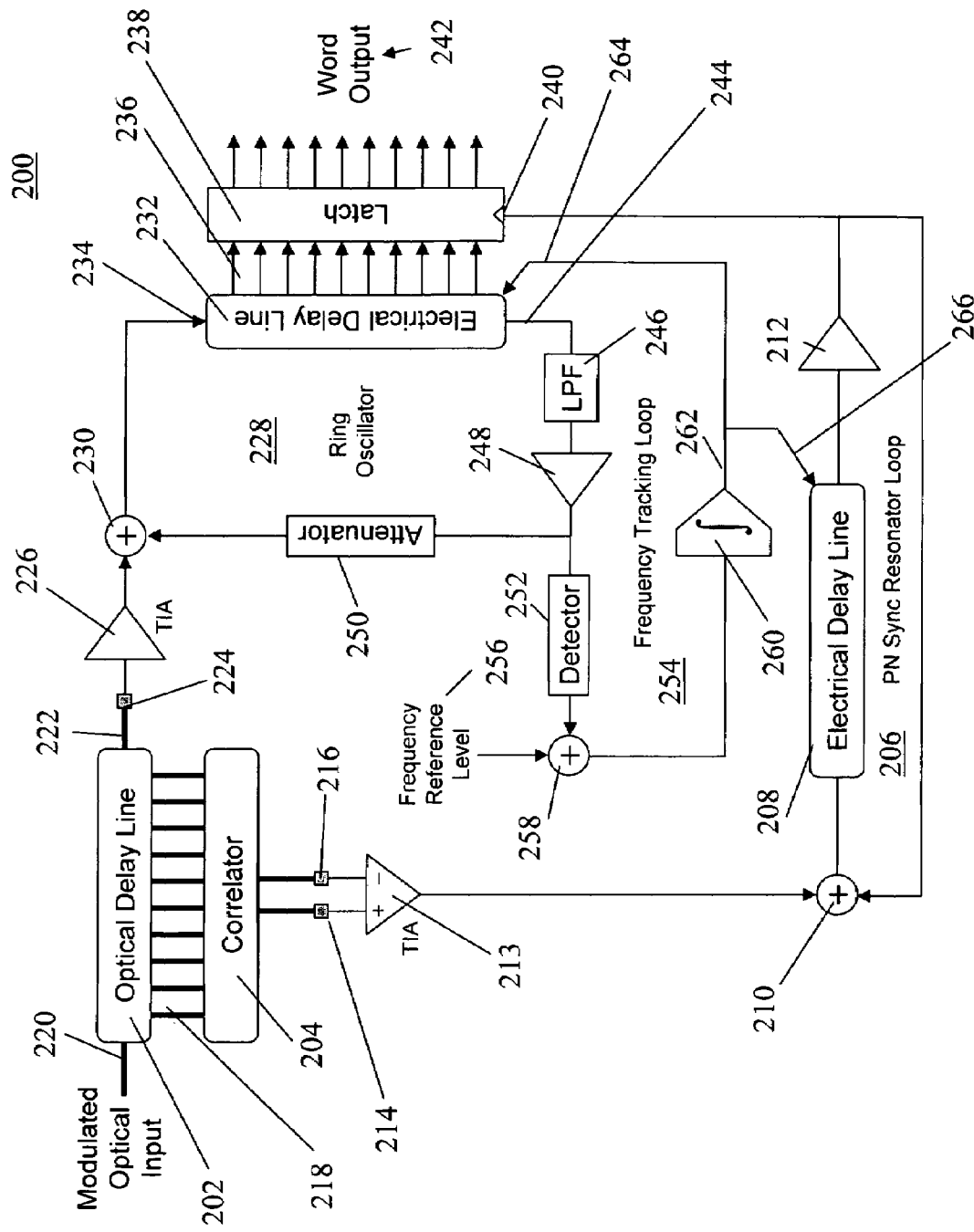
FIG. 3 is a schematic block diagram of a receiver that employs a tapped delay line demultiplexer to receive and decode a modulated encoded transmission signal in accordance with a second preferred embodiment of the invention.

FIG. 3 illustrates another embodiment of a receiver 200 in which an optical tapped delay line 202 and an optical sliding window correlator 204 are employed in place of the electrical versions of the same elements in the receiver 100 of FIG. 2. Otherwise, the receiver 200 includes many of the same elements of the receiver 100 and operates in much the same manner. These elements include a PN synchronization resonator loop 206, including an electrical delay line 208, adder circuit 210 and amplifier 212. The adder circuit 210 receives input from a first trans-impedance amplifier 213 that receives its input from the optical correlator 204 through a pair of detector diodes 214 and 216. The optical correlator 204 continually samples the values of the optical information in each stage of the optical delay line 202 through each of (m) taps 218.

The optical delay line 202 receives a modulated optical waveform in an input 220 and passes this waveform, after a delay determined by the delay characteristics and length of the delay line 202, out a serial output 222. The waveform than passes through a third detector diode 224 and a second trans-impedance amplifier 226 and enters a ring oscillator loop 228 via an adder circuit 230. An analog tapped delay line 232 is provided in the oscillator loop 228 that receives the now electrical waveform through a serial input 234. The analog tapped delay line 232 includes a group of (m) parallel output taps 236 that are connected to an (m) bit parallel output latch 238. The output latch 238 is controlled by the signal in the resonator loop 206 through a control input 240. When the latch 238 receives a control signal, it latches the symbols or bits that are present in the delay line 232 and provides them as a word output 242.

The analog tapped delay line 232 also passes the incoming waveform through a serial output 244 to other elements that complete the ring oscillator 228, including a low pass filter 246, an amplifier 248 and an attenuator 250. The output from the amplifier 248 is also fed into a frequency detector 252 that forms part of a frequency tracking loop 254. A frequency reference level 256 is combined in an adder circuit 258 with the output from the detector 252. The output from the adder circuit 258 then passes through an integrator 260, which generates a control signal on an output 262 that is connected to a control input 264 of the analog tapped delay line 232 and a control input 266 of the electrical delay line 208 to control their frequency characteristics. Each of the loops in the receiver 200, including the resonator loop 206, the ring oscillator 228 and the frequency tracking loop 254 otherwise serves the same function as the corresponding elements in the receiver 100 of FIG. 2.

In conclusion, the present invention employs delay lines and their tapped versions to achieve modulation and demodulation signal processing functions for a transmitter, receiver or transceiver, and is particularly suited for use with optical transceivers. Faster data acquisition by a receiver using a short data frame preamble is made possible with this invention's sliding window correlator. The correlator resolves the phase of the input waveform for all possible phase possibilities since the delay line in the PN sync resonator loop has the same electrical transit time as the tapped delay line which feeds the latch. The PN resonator loop, which by design resonates at the frame rate, is driven by the output of the sliding window correlator which delivers a pulse to the loop each time a new word is centered in the tapped delay line. By using a preamble of a relatively few words that are just the frame sync code, the PN resonator loop is able to provide a word clock to the output latch before any data is present. Environmental or age induced drift in the transit time of the tapped delay line of the PN sync resonator loop is calibrated out through the use of the frequency calibration loop imbedded within the tapped delay line. The accuracy of this calibration loop is sufficient to ensure that the data "eyes" are centered on the inputs of the output latch at the instant of phase recognition from the aforementioned sliding window correlator. All of these functions are enabled by the combination of the high data rates (typically 10s of picosecond time intervals), high-speed InP processors (100 Gigahertz devices), and analog delay lines which heretofore have been undesirable. Current tape transfer techniques provide stabile media thereby achieving the required delay line accuracy. Additional accuracy can be obtained through active tracking through calibration tones.

The invention is therefore advantageous in that it provides high-speed acquisition for a burst data message using a feed-forward processor rather than a phased-lock-loop processor with a longer acquisition time. It therefore does not require acquisition times that are currently orders of magnitude longer than the messages. The opposite is true for the invention; it requires less than a 0.1% of the frame time. It requires no high-speed sampling circuitry that has an attendant high power and usually higher cost. Its lower power and smaller size enables a single chip demux at 40 Gbps for example. This would make a very attractive product especially for a market place that will be increasingly packetized and burst traffic oriented. The demultiplexed output is unambiguously referenced to the first bit in each PN coded frame. This eliminates the need for approximately ⅓ of the demux ASIC complexity downstream to resolve the inherent data ambiguity that is presented on the output of the prior art form.

Although the invention has been disclosed in terms of a number of preferred embodiments, it will be understood that numerous variations and modifications could be made thereto without departing from the scope of the invention as defined in the following claims.

What is claimed is:

1. Apparatus for receiving a serial data stream comprised of a plurality of multiple symbol data words and converting said data stream into a parallel data stream, said apparatus comprising:
    a first delay line, said first delay line being a tapped analog delay line including a serial input for receiving said serial data stream, a serial output, a plurality of stages between said serial input and said serial output, and a plurality of parallel output taps, one for each of said stages;
    a ring oscillator including a loop having said first delay line inserted therein for monitoring a transmission frequency of said multiple symbol data words;
    a frequency tracking loop for calibrating said ring oscillator, said tracking loop generating a control signal that is connected to said control input of said first delay line to control the delay characteristics of said first delay line, and thereby control the oscillation frequency of said ring oscillator;
    a multiple bit output latch having a plurality of parallel inputs for simultaneously receiving each symbol of one of said multiple symbol data words in said data stream, a corresponding plurality of parallel outputs and a control input for selectively latching symbol values that are present at said latch inputs onto said latch outputs, said parallel inputs each being connected to a corresponding one of said parallel output taps of said first delay line; and
    means for detecting when the symbols of any serial data word are aligned in said stages of said first delay line, and in response thereto, supplying a latch control signal to said latch control input, said means for detecting comprising a sliding window correlator for correlating signal values on each of said delay line parallel output taps with reference signal values and generating a correlator output signal having a magnitude that is increased when the symbols of any serial data word are aligned in said stages of said first delay line; and a resonator loop for adding a present value of said correlator output signal with one or more previous values of said correlator output signal and thereby generating a latch control signal that includes a spike which occurs when the symbols of any serial data word are aligned in said stages of said first delay line and is of sufficient magnitude to cause said output latch to latch the symbols in said stages of said first delay line onto said outputs of said output latch;
    whereby, when the symbols of any serial data word are aligned in said stages of said first delay line, the symbols will be output as a multiple bit parallel data word on said latch outputs.

2. The apparatus of claim 1, wherein said resonator loop includes a second delay line having a delay line length that is selected to match the transmission frequency of said words, said second delay line having a control input connected to receive said control output from said frequency tracking loop.

3. The apparatus of claim 1, wherein each of said words is PN encoded and said sliding window correlator is programmed to detect when the symbols of any PN encoded word are present in the stages of said first delay line by correlating the signals on the parallel output stages with a reference PN encoded data word.

4. The apparatus of claim 1, wherein said apparatus is a receiver and further includes:
    an optical detector for detecting an optically modulated transmission signal, said detector having an output; and
    an amplifier having an input connected to said output of said detector and an output connected to said serial input of said first delay line.

5. The apparatus of claim 4, wherein said apparatus is a transceiver and further includes a transmitter comprising:
    a multiple bit input latch for receiving parallel bits of a multiple bit data word to be transmitted, said latch including a plurality of parallel inputs and a corresponding plurality of parallel outputs, one fur each bit;
    an encoder for encoding each bit of said data word into a corresponding symbol, said encoder having a plurality of parallel inputs each connected to a corresponding one of said latch outputs and a corresponding plurality of parallel outputs;
    a third delay line, said delay line being an analog tapped delay line including a serial input, a serial output, a delay control input, a plurality of stages between said input and said output, and a plurality of taps connected one each to a corresponding one of said stages, each of said taps being connected to a corresponding one of said encoder outputs to receive a corresponding one of said encoded symbols from said encoder; and
    a modulator for receiving a serial data stream from said serial output of said third delay line and generating a modulated waveform for transmission.

6. The apparatus of claim 5, further including:
    a second ring oscillator connecting said serial input and serial output of said third delay line for monitoring a transmission frequency of said transmitter; and
    a frequency tracking loop connected to said ring oscillator for generating a frequency control signal to be applied to said delay control input of said third delay line.

7. Apparatus for receiving a serial data stream comprised of a plurality of multiple symbol data words and converting said data stream into a parallel data stream, said apparatus comprising:
    a first delay line, said first delay line being an analog tapped delay line including a serial input for receiving said serial data stream, a serial output, a plurality of stages between said serial input and said serial output, and a plurality of parallel output taps, one for each of said stages;
    a second delay line, said second delay line being an analog tapped delay line including a serial input for receiving said serial data stream from said serial output of said first delay line, a serial output, a plurality of stages between said serial input and said serial output, and a plurality of parallel output taps, one for each of said stages;
    a ring oscillator including a loop having said second delay line inserted therein for monitoring a transmission frequency of said serial data words;
    a frequency tracking loop for calibrating said ring oscillator, said tracking loop generating a control signal that is connected to said control input of said second delay line to control the delay characteristics of said second delay line, and thereby control the oscillation frequency of said ring oscillator;

a multiple bit output latch having a plurality of parallel inputs for simultaneously receiving each symbol of one of said multiple symbol data words in said data stream, a corresponding plurality of parallel outputs and a control input for selectively latching symbol values that are present at said latch inputs onto said latch outputs, said parallel inputs each being connected to a corresponding one of said parallel output taps of said second delay line; and means for detecting when the symbols of any serial data word are aligned in said stages of said first delay line, and in response thereto, supplying a latch control signal to said latch control input; said means for detecting comprising a sliding window correlator for correlating signal values on each of said first delay line parallel output taps with reference signal values and generating a correlator output signal having a magnitude that is increased when the symbols of any serial data word are aligned in said stages of said first delay line; and a resonator loop for adding a present value of said correlator output signal with one or more previous values of said correlator output signal and thereby generating a latch control signal that includes a spike which occurs when the symbols of any serial data word are aligned in said stages of said first delay line and is of sufficient magnitude to cause said output latch to latch the symbols in said stages of said second delay line onto said outputs of said output latch;

whereby, when the symbols of any serial data word are aligned in said stages of said first delay line, the symbols of another serial data word in said second delay line will be output as a multiple bit parallel data word on said latch outputs.

8. The apparatus of claim 7, wherein said resonator loop includes a third delay line having a delay line length that is selected to match the transmission frequency of said serial data words, said third delay line having a control input connected to receive said control output from said frequency tracking loop.

9. The apparatus of claim 7, wherein each of said words is PN encoded and said sliding window correlator is programmed to detect when the symbols of any PN encoded word are present in the stages of said first delay line by correlating the parallel output stages with a reference PN encoded data word.

10. The apparatus of claim 7, wherein said first delay line is an optical delay line and said apparatus is a receiver that further includes:

an optical detector connected to said serial output of said optical delay line for detecting an optically modulated transmission signal, said detector having an output; and an amplifier having an input connected to said output of said detector and an output for supplying said serial data stream to said serial input of said second delay line.

11. The apparatus of claim 10, wherein said apparatus is a transceiver and further includes a transmitter comprising:

a multiple bit input latch for receiving parallel bits of a multiple bit data word to be transmitted, said latch including a plurality of parallel inputs and a corresponding plurality of parallel outputs, one for each bit;

an encoder for encoding each bit of said data word into a corresponding symbol, said encoder having a plurality of parallel inputs each connected to a corresponding one of said latch outputs and a corresponding plurality of parallel outputs;

a fourth delay line, said delay line including a serial input, a serial output, a delay control input, a plurality of stages between said input and said output, and a plurality of taps connected one each to a corresponding one of said ages, each of said taps being connected to a corresponding one of said encoder outputs to receive a corresponding one of said encoded symbols from said encoder; and a modulator for receiving a serial data stream from said serial output of said fourth delay line and generating a modulated waveform for transmission.

12. The apparatus of claim 11, further including:

a second ring oscillator connecting said serial input and serial output of said fourth delay line for monitoring a transmission frequency of said transmitter; and a frequency tracking loop connected to said ring oscillator for generating a frequency control signal to be applied to said delay control input of said fourth delay line.

13. A method for receiving a serial data stream comprised of a plurality of multiple symbol data words and converting said data stream into a parallel data stream comprising the steps of:

supplying a serial data stream to a serial input of a first delay line, said delay line being a tapped analog delay line and also including a serial output, a plurality of stages between said serial input and said serial output, and a plurality of parallel output taps, one for each of said stages;

monitoring a transmission frequency of said serial data words;

generating a control signal in response to said frequency;

employing said control signal to control the delay characteristics of said first delay line;

detecting when the symbols of any serial data word are aligned in said stages of said first delay line by correlating signal values on each of said delay line parallel output taps with reference signal values and thereby generating a correlator output signal having a magnitude that is increased when the symbols of any serial data word are aligned in said stages of said first delay line; and adding a present value of said correlator output signal with one or more previous values of said correlator output signal and thereby generating a latch control signal that includes a spike which occurs when the symbols of any serial data word are aligned in said stages of said first delay line, and in response thereto;

supplying said latch control signal to a latch control input of a multiple bit output latch having a plurality of parallel inputs for simultaneously receiving each symbol of any one of said multiple symbol data words in said data stream, a corresponding plurality of parallel outputs and said control input for selectively latching symbol values that are present at said latch inputs onto said latch outputs, said parallel inputs each being connected to a corresponding one of said parallel output taps of said first delay line;

whereby, when the symbols of any serial data word are aligned in said stages of said first delay line, the symbols will be output as a multiple bit parallel data word on said latch outputs.

14. The method of claim 13, wherein each of said words is PN encoded and said step of correlating comprises correlating the signals on the parallel output stages of said first delay line with a reference PN encoded data word.

15. The method of claim 13, further comprising the steps of:

detecting an optically modulated transmission signal, said detector generating an output; and amplifying said detector output to form said serial data stream to be fed into said delay line input.

16. The method of claim 15, further comprising the steps of:

encoding each bit of a multiple parallel bit data word as a corresponding symbol;

inputting each of said symbols into a corresponding one of a plurality of stages of a second delay line, said delay line including a serial input and a serial output between which said plurality of stages is disposed; and modulating a serial data stream being output from said serial output, thereby generating a modulated waveform for transmission.

17. The method of claim 16, further comprising the steps of:

monitoring a transmission frequency of said transmitter; and adjusting the delay characteristics of said delay line to control said transmission frequency.

* * * * *